United States Patent
Law et al.

(10) Patent No.: US 9,991,674 B2
(45) Date of Patent: Jun. 5, 2018

(54) OPTICAL TRANSMITTER WITH A HEAT DISSIPATION STRUCTURE

(71) Applicant: LuxNet Corporation, Zhongli, Taoyuan County (TW)

(72) Inventors: Pi-Cheng Law, Zhongli (TW); Po-Chao Huang, Zhongli (TW); Hsing-Yen Lin, Zhongli (TW); Chung-Hsin Fu, Zhongli (TW); Hua-Hsin Su, Zhongli (TW)

(73) Assignee: LUXNET CORPORATION, Zhongli, Taoyuan County (TW)

(*) Notice: Subject to any disclaimer, the term of this patent is extended or adjusted under 35 U.S.C. 154(b) by 0 days. days.

(21) Appl. No.: 15/354,261

(22) Filed: Nov. 17, 2016

(65) Prior Publication Data
US 2018/0019569 A1    Jan. 18, 2018

(30) Foreign Application Priority Data
Jul. 18, 2016  (TW) .............................. 105122606 A

(51) Int. Cl.
*H01S 5/024* (2006.01)
*H01S 5/022* (2006.01)

(52) U.S. Cl.
CPC ...... *H01S 5/02469* (2013.01); *H01S 5/02208* (2013.01); *H01S 5/02284* (2013.01); *H01S 5/02288* (2013.01); *H01S 5/02296* (2013.01); *H01S 5/02438* (2013.01)

(58) Field of Classification Search
CPC ............. H01S 5/02469; H01S 5/02476; H01S 5/02208; H01S 5/02438; H01S 5/0224
See application file for complete search history.

(56) References Cited

U.S. PATENT DOCUMENTS

| | | | | |
|---|---|---|---|---|
| 2002/0048295 | A1* | 4/2002 | Kato | H01S 5/02469 |
| | | | | 372/36 |
| 2007/0243645 | A1* | 10/2007 | Lin | H01L 33/486 |
| | | | | 438/26 |
| 2008/0008217 | A1* | 1/2008 | Miller | H01S 5/024 |
| | | | | 372/36 |
| 2011/0024785 | A1* | 2/2011 | Ng | H01L 33/642 |
| | | | | 257/99 |

* cited by examiner

*Primary Examiner* — Michael Carter
(74) *Attorney, Agent, or Firm* — Muncy, Geissler, Olds & Lowe, P.C.

(57) ABSTRACT

An optical transmitter with a heat dissipation structure is provided. The heat dissipation structure comprises a substrate and an optical transmitter unit. The substrate comprises a base body, a heat dissipation well disposed on the base body, and a thermal conductive block inserted into and fixed to the heat dissipation well. The thermal conductive block has on one side thereof a heat guiding plane. The optical transmitter unit comprises a heat dissipating substrate directly disposed on the heat guiding plane, and a laser diode directly disposed on the heat dissipating substrate. The laser diode features an active region whose height is lowered to shorten a heat conduction path wherein heat is transferred from the active region through the heat dissipating substrate to the heat guiding plane. The heat already transferred to the heat guiding plane is transferred horizontally by the thermal conductive block to the base body which encloses the heat dissipation well.

19 Claims, 10 Drawing Sheets

OPTICAL TRANSMITTER WITH A HEAT DISSIPATION STRUCTURE

BACKGROUND OF THE INVENTION

Field of the Invention

The present invention relates to optical transmitter with a heat dissipation structure and, more particularly, to an optical transmitter with a heat dissipation structure for enhancing efficiency of heat dissipation greatly.

Description of the Prior Art

Due to the ever-increasing processing speed and processing capacity of computers, conventional cable-based telecommunication transmission is so restricted by bandwidth and transmission speed that it is no longer effective in transmitting the voluminous data to be processed at any time to meet technological needs nowadays. In view of this, conventional telecommunication transmission systems have been gradually replaced by optical fiber transmission systems. The optical fiber transmission systems advantageously get rid of bandwidth limitations, enable high-speed and long-distance transmission, and are made of materials insusceptible to electromagnetic interference. Therefore, the optical fiber transmission systems will not only dominate communication technology in the near future, but they are also presently studied intensively by electronic manufacturers.

Optical communication technology entails transmitting light signals between two nodes of an optical fiber with a signal carrier which a light wave functions as. Depending on its transmission medium, light communication technology falls into two categories, namely light communication side and electrical communication side, for converting received light signals through an optical transceiver into electrical signals which can be processed by chips and converting data-processed electrical signals through the optical transceiver into light signals. Hence, optical communication technology effectuates transmission with optical fibers and serves communication purposes.

With wavelength-division multiplexing (WDM), optical signals, using laser light carriers associated with different wavelengths, are multiplexed so as to be transmitted over an optical fiber so that the optical fiber fulfills bidirectional transmission of optical signals and additive transmission capacity. In practice, the operating wavelength spectra of an optical fiber are divided into multiple channels, each of which corresponds to a carrier wavelength, and thus more data carried by more optical carrier signals can be transmitted over the optical fiber.

When WDM is applied to data exchange that takes place at a data center, it is necessary to increase the amount of data for use in information transmission in order to meet the need for real-time data transmission and high-speed computation at the data center. Since an information system always process voluminous data, the output power of an optical transmitter (TOSA) must be high enough to allow a sufficiently large amount of data to be transmitted per unit time and thus processed by the information system.

However, an enormous increase in power leads to an increase in the number of chips of a light emission module required in the course of signal transmission to meet the need for an increasingly large load of processing and operation, thereby generating lots of heat with high temperature. The heat thus generated is never spontaneously dissipated; instead, it accumulates. In high-temperature surroundings, signal transmission carried out with an optical fiber is unstable, and thus an optical fiber transmission system or equipment thereof ends up in a vicious cycle of an ever-increasing ambient temperature; eventually, the optical fiber transmission speed becomes low and even it jeopardizes the chips or related parts and components. In the worst-case scenario, the whole optical fiber transmission system or its equipment gets damaged and thus become unusable.

Considering that the prior art still has room for improvement, it is necessary to provide a solution of dissipating the heat generated from a chip, so as to ensure the stability and safety of the optical fiber transmission system or its equipment.

SUMMARY OF THE INVENTION

The main purpose of the present invention is to solve the problem of insufficient heat dissipation of high-power optical transmitter.

In order to solve the above problem, the present invention provides an optical transmitter with a heat dissipation structure, comprising a substrate, and an optical transmitter unit. The substrate comprising a base body, a heat dissipation well disposed on the base body, and a thermal conductive block inserted into and fixed to the heat dissipation well and having a side with a heat guiding plane thereon. The optical transmitter unit disposed on the thermal conductive block and comprising a heat dissipating substrate directly disposed on the heat guiding plane and a laser diode directly disposed on the heat dissipating substrate, wherein the laser diode has an active region whose height is lowered to shorten a heat conduction path of heat transferred from the active region through the heat dissipating substrate to the heat guiding plane, wherein the heat already transferred to the heat guiding plane is transferred horizontally to the base body enclosing the heat dissipation well.

Preferably, the substrate is a housing which comprises an optical calibration window, a coupling lens disposed on thermal conductive block at one side of the optical calibration window, and the optical transmitter unit disposed in the housing and aligned with the optical calibration window through the coupling lens. The lateral side of the housing has an optical calibration cylinder, which is disposed on the optical calibration window and corresponding in position to the laser diode. The optical calibration cylinder comprises a Z-axis positioning cylinder coupled to the optical calibration window laterally as well as an optical receptacle insertedly disposed at the Z-axis positioning cylinder to connect with an optical fiber.

Preferably, the coupling lens are directly disposed on the thermal conductive block.

Preferably, the heat dissipation well penetrates the housing such that two sides of the thermal conductive block are exposed to two opposite openings of the heat dissipation well, respectively, and the housing encloses the thermal conductive block laterally and peripherally. One side of the thermal conductive block protruding toward the inside of the housing adjoins the optical transmitter unit, and the other outward-exposed side of the thermal conductive block is in contact with a heat guiding pad.

Preferably, the housing comprises a base which comes with the thermal conductive block and an upper lid which covers the base to provide the optical transmitter unit with a hermetic seal. The base has two sides which two first sidewalls are disposed on, respectively, and two first step segments are disposed on the first sidewalls, respectively, and the upper lid has two sides which two second sidewalls corresponding to the first sidewalls are disposed on, respectively, and the second sidewalls each have thereon a second step segment whereas the second step segment and the first step segment are engaged with each other, respectively. The first sidewall of the base extends to form a first slope portion and the second sidewall of the upper lid extends to form a second slope portion, wherein the second slope portions and the first slope portions are engaged with each other, respectively. The first slope portions extend forward to form an engaging platform and the second slope portions extend to form a protruding portion which is laterally inclined to the engaging platform at a chamfering angle and disposed at the front end of the upper lid resting on the engaging platform.

Preferably, the optical calibration window comprises an optical channel aligned with the coupling lens and an insertion groove disposed on the optical channel for the optical isolator inserted into and thus fixed in place, and a yielding groove is disposed on one side of the insertion groove as well as the inner diameter of the yielding groove is larger than the inner diameter of the insertion groove.

Preferably, the housing has thereon a circuit substrate, wherein the circuit substrate comprises a substrate body, an electrical connection side disposed at one end of the substrate body and connected to the optical transmitter unit, and an electrical connection port disposed at one end of the substrate body and opposite to the electrical connection side, wherein an adhesive for blocking heat from the housing is applied to the interface between the electrical connection side and the housing so that the heat is prevented from returning to the optical transmitter unit through gold bonding wires of the electrical connection side.

Preferably, the heat dissipating substrate is a ceramic heat dissipating substrate, the ceramic heat dissipating substrate is made of aluminum nitride (AlN), silicon carbide (SiC) or aluminum oxide ($Al_2O_3$).

Preferably, the distance between the active region of the laser diode and the contact interface of the laser diode and the heat dissipating substrate ranges from 2 µm to 14 µm.

Preferably, the heat guiding plane of the thermal conductive block is parallel to the surface of the base body.

Preferably, the thermal conductive block is made of copper (Cu), copper alloy, copper-molybdenum (CuMo), copper-tungsten (CuW), aluminum (Al), aluminum alloy, or heat-dissipating ceramics.

Preferably, the laser diode is an edge emitting laser diode.

Another object of the present invention is to provide an optical transmitter with a heat dissipation structure, comprising a substrate, and an optical transmitter unit. The substrate comprising a base body, a heat dissipation well disposed on the base body, and a thermal conductive block inserted into and fixed to the heat dissipation well, wherein one side of the thermal conductive block protrudes from the base body and is taller than the base body by a height and thermal conductive block has a heat guiding plane at the height. The optical transmitter unit disposed on the thermal conductive block and comprising a laser diode directly disposed on the heat dissipating substrate, with the laser diode having an active region whose height is lowered to shorten a heat conduction path of heat transferred from the active region to the heat guiding plane, wherein the heat already transferred to the heat guiding plane is transferred horizontally to the base body enclosing the heat dissipation well.

Preferably, the substrate is a housing which comprises an optical calibration window, a coupling lens disposed on thermal conductive block at one side of the optical calibration window, and the optical transmitter unit disposed in the housing and aligned with the optical calibration window through the coupling lens. The lateral side of the housing has an optical calibration cylinder, which is disposed on the optical calibration window and corresponding in position to the laser diode. The optical calibration cylinder comprises a Z-axis positioning cylinder coupled to the optical calibration window laterally as well as an optical receptacle insertedly disposed at the Z-axis positioning cylinder to connect with an optical fiber.

Preferably, the heat dissipation well penetrates the housing such that two sides of the thermal conductive block are exposed to two opposite openings of the heat dissipation well, respectively, and the housing encloses the thermal conductive block laterally and peripherally. One side of the thermal conductive block protruding toward the inside of the housing adjoins the optical transmitter unit, and the other outward-exposed side of the thermal conductive block is in contact with a heat guiding pad.

Preferably, the housing comprises a base which comes with the thermal conductive block and an upper lid which covers the base to provide the optical transmitter unit with a hermetic seal. The base has two sides which two first sidewalls are disposed on, respectively, and two first step segments are disposed on the first sidewalls, respectively, and the upper lid has two sides which two second sidewalls corresponding to the first sidewalls are disposed on, respectively, and the second sidewalls each have thereon a second step segment whereas the second step segment and the first step segment are engaged with each other, respectively. The first sidewall of the base extends to form a first slope portion and the second sidewall of the upper lid extends to form a second slope portion, wherein the second slope portions and the first slope portions are engaged with each other, respectively. The first slope portions extend forward to form an engaging platform and the second slope portions extend to form a protruding portion which is laterally inclined to the engaging platform at a chamfering angle and disposed at the front end of the upper lid resting on the engaging platform.

Preferably, the optical calibration window comprises an optical channel aligned with the coupling lens and an insertion groove disposed on the optical channel for the optical isolator inserted into and thus fixed in place, and a yielding groove is disposed on one side of the insertion groove as well as the inner diameter of the yielding groove is larger than the inner diameter of the insertion groove.

Preferably, the housing has thereon a circuit substrate, wherein the circuit substrate comprises a substrate body, an electrical connection side disposed at one end of the substrate body and connected to the optical transmitter unit, and an electrical connection port disposed at one end of the substrate body and opposite to the electrical connection side, wherein an adhesive for blocking heat from the housing is applied to the interface between the electrical connection side and the housing so that the heat is prevented from returning to the optical transmitter unit through gold bonding wires of the electrical connection side.

Preferably, the distance between the active region of the laser diode and the contact interface of the laser diode and the heat guiding plane ranges from 2 µm to 14 µm.

Preferably, the thermal conductive block is made of copper (Cu), copper alloy, copper-molybdenum (CuMo), copper-tungsten (CuW), aluminum (Al), aluminum alloy, or heat-dissipating ceramics.

Preferably, the laser diode is an edge emitting laser diode.

Therefore, compared with the prior art, the present invention provides an optical transmitter with a heat dissipation structure and an optical transmitter having the same, intended to enhance the efficiency of heat dissipation greatly and characterized in that: a laser diode features an active region whose height is lowered to shorten a heat conduction path; heat is directly transferred from the active region to a thermal conductive block through a heat dissipating substrate, so as to effectuate heat dissipation through direct heat conduction; and the heat is spread by means of a heat dissipation well horizontally.

The present invention is further characterized in that an adhesive is applied to the interface between an electrical connection side of a circuit substrate and a housing to insulate the housing thermally so that heat already transferred to the housing is prevented from returning to the laser diode through gold bonding wires to influence the efficiency of dissipating heat from the laser diode.

DETAILED DESCRIPTION OF THE EMBODIMENT OF THE INVENTION

In the following detailed description, for the purpose of explanation, numerous specific details are set forth in order to provide a thorough understanding of the disclosed embodiments. The scale of the figures may not be drawn in its actual proportion but may be exaggerated for the convenience of illustration. The figures and its scale are not restrictive to the present invention.

Figure 1:
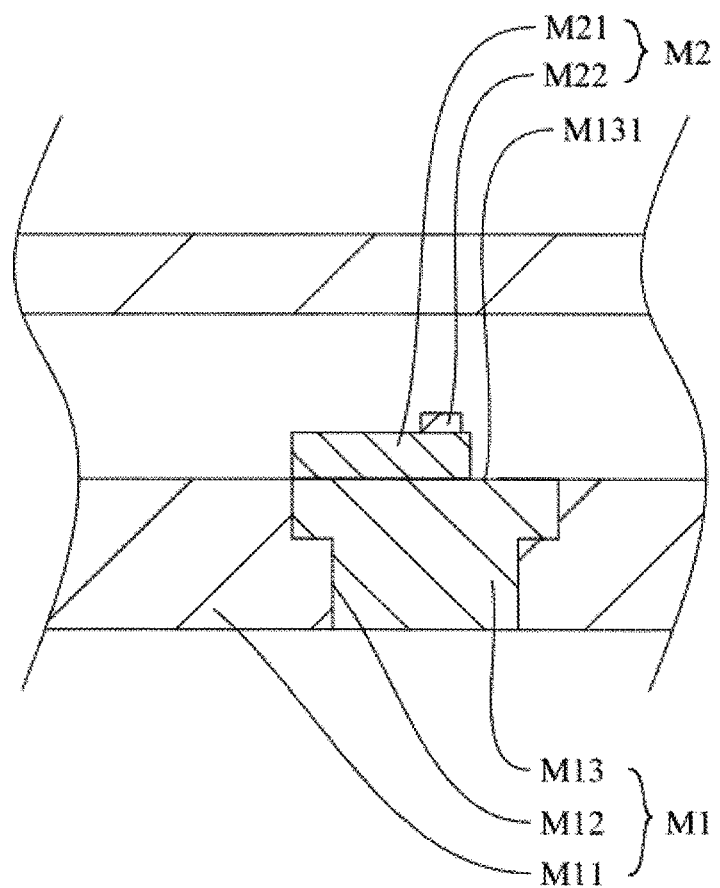
FIG. 1 is a schematic view of the heat dissipation structure of optical transmitter according to a preferred embodiment of the present invention.

An optical transmitter with a heat dissipation structure of the present invention is hereunder described with reference to drawings. Referring to FIG. 1, there is shown a schematic view of a heat dissipation structure of optical transmitter according to a preferred embodiment of the present invention, and the diagram illustrates the present invention hereunder.

A heat dissipation structure M of optical transmitter of the present invention comprises a substrate M1 and an optical transmitter unit M2 disposed on the substrate M1. The substrate M1 comprises a base body M11, a heat dissipation well M12 disposed on the base body M11, and a thermal conductive block M13 inserted into and fixed to the heat dissipation well M12. The thermal conductive block M13 has on one side thereof a heat guiding plane M131. The heat dissipation well M12 penetrates the base body M11 such that two sides of the thermal conductive block M13 are exposed to two opposite openings of the heat dissipation well M12, respectively, and the base body M11 encloses the thermal conductive block M13 laterally and peripherally. The side (i.e., the heat guiding plane M131) attributed to the thermal conductive block M13 and protruding toward the inside of the base body M11 adjoins the optical transmitter unit M2. The other side of the thermal conductive block M13 is in contact with air, a heat guiding pad 702 (shown in FIG. 10) on a light communication device, or the inner side of a housing of the light communication device, but the present invention is not limited thereto. The optical transmitter unit M2 comprises a heat dissipating substrate M21 directly disposed on the heat guiding plane M131, and a laser diode M22 directly disposed on the heat dissipating substrate M21. The laser diode M22 features an active region whose height is lowered to shorten a heat conduction path wherein heat is transferred from the active region through the heat dissipating substrate M21 to the heat guiding plane M131. The heat already transferred to the heat guiding plane M131 is transferred horizontally by the thermal conductive block M13 to the base body M11 which encloses the heat dissipation well M12. In a preferred embodiment, the heat guiding plane M131 of the thermal conductive block M13 is parallel to the surface of the base body M11 to reduce difficulties in tolerance-induced coupling.

In a preferred embodiment, to enhance the efficiency of heat dissipation, the heat dissipating substrate M21 is a ceramic heat dissipating substrate. The ceramic heat dissipating substrate is, for example, made of aluminum nitride (AlN), silicon carbide (SiC), or aluminum oxide ($Al_2O_3$), a combination thereof, or a composite material which displays the same properties as the aforesaid materials, whereas the thermal conductive block M13 is made of copper (Cu), copper alloy, copper-molybdenum (CuMo), copper-tungsten (CuW), aluminum (Al), aluminum alloy, or heat-dissipating ceramics, but the present invention is not limited thereto.

Upon reduction of the height of the active region, the distance between the active region of the laser diode M22 and the contact interface of the laser diode M22 and the heat dissipating substrate M21 ranges from 2 µm to 14 µm. The efficiency of heat dissipation is greatly enhanced by reducing the distance between the active region and the heat dissipating substrate M21. The distance does not include the thickness of a solder.

In this embodiment, a space (to the right of the optical transmitter unit M2 shown in FIG. 1) for receiving a coupling lens (not shown) is reserved above the thermal conductive block M13. By placing the optical transmitter unit M2 and a coupling lens directly on the same plane of the thermal conductive block M13, it is feasible to ignore a tolerance arising from the thermal conductive block M13, thereby enhancing the coupling effect and increasing the product yield.

Figure 2:
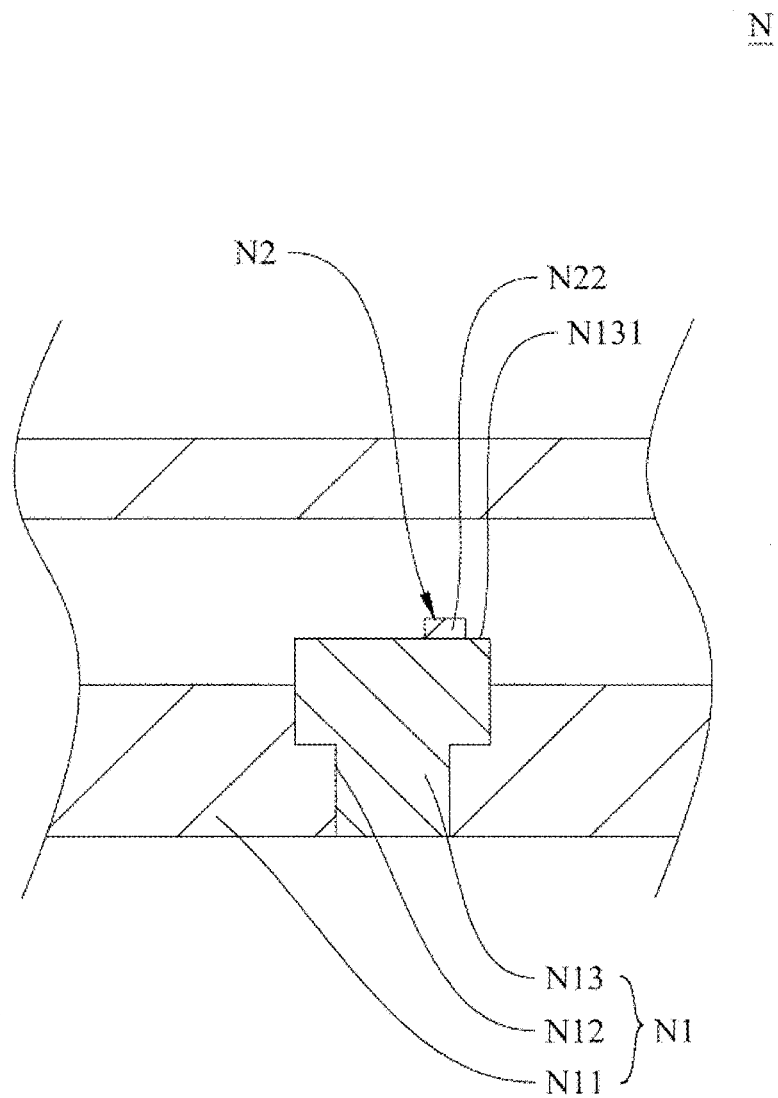
FIG. 2 is a schematic view of the heat dissipation structure of optical transmitter according to another preferred embodiment of the present invention.

The optical transmitter with a heat dissipation structure according to another preferred embodiment of the present invention is illustrated with a diagram and described hereunder. FIG. 2 is a schematic view of the optical transmitter with a heat dissipation structure according to another preferred embodiment of the present invention, and the present invention is described hereunder with reference to the diagram.

This embodiment is distinguished from the preceding embodiment mainly by the thermal conductive block N13. Due to the thermal conductive block N13, this embodiment dispenses with a heat dissipating substrate (i.e., the heat dissipating substrate M21 shown in FIG. 1) as well as parts and components which might otherwise be required for an optical transmitter. In this embodiment, an optical transmitter with a heat dissipation structure N comprises a substrate N1 and an optical transmitter unit N2 disposed on the substrate N1. The substrate N1 comprises a base body N11, a heat dissipation well N12 disposed on the base body N11, and a thermal conductive block N13 inserted into and fixed to the heat dissipation well N12. One side of the thermal conductive block N13 protrudes from the base body N11 and is taller than the base body N11 by a height. The thermal conductive block N13 has a heat guiding plane N131 at the height. The optical transmitter unit N2 comprises a laser diode N22 directly disposed on the heat guiding plane N131. The laser diode N22 features an active region whose height is lowered to shorten a heat conduction path wherein heat is transferred from the active region to the heat guiding plane N131. The heat already transferred to the heat guiding plane N131 is transferred horizontally to the base body N11 which encloses the heat dissipation well N12.

Upon reduction of the height of the active region, the distance between the active region of the laser diode N22 and the contact interface of the laser diode N22 and the heat guiding plane N131 ranges from 2 μm to 14 μm. The efficiency of heat dissipation is greatly enhanced by reducing the distance between the active region and the thermal conductive block N13. The distance does not include the thickness of a solder.

The optical transmitter of the present invention can be applied to Pulse Amplitude Modulation N (PAM-N), Quadrature Amplitude Modulation (QAM), Discrete Multi-tone (DMT), Binary Phase Shift Keying (BPSK), Quadrature Phase Shift Keying (QPSK), and related light communication modulation technology, but the present invention is not limited thereto.

Moreover, the optical transmitter of the present invention can not only be applied to a light communication device with a single channel, but can also be applied to Wavelength Division Multiplexing (WDM), Conventional/Coarse Wavelength Division Multiplexing (CWDM), Dense Wavelength Division Multiplexing (DWDM), Optical Add/Drop Multiplexer (OADM), Reconfigurable Optical Add/Drop Multiplexer (ROADM), and related light communication multiplexing technology, but the present invention is not limited thereto.

Figure 3:
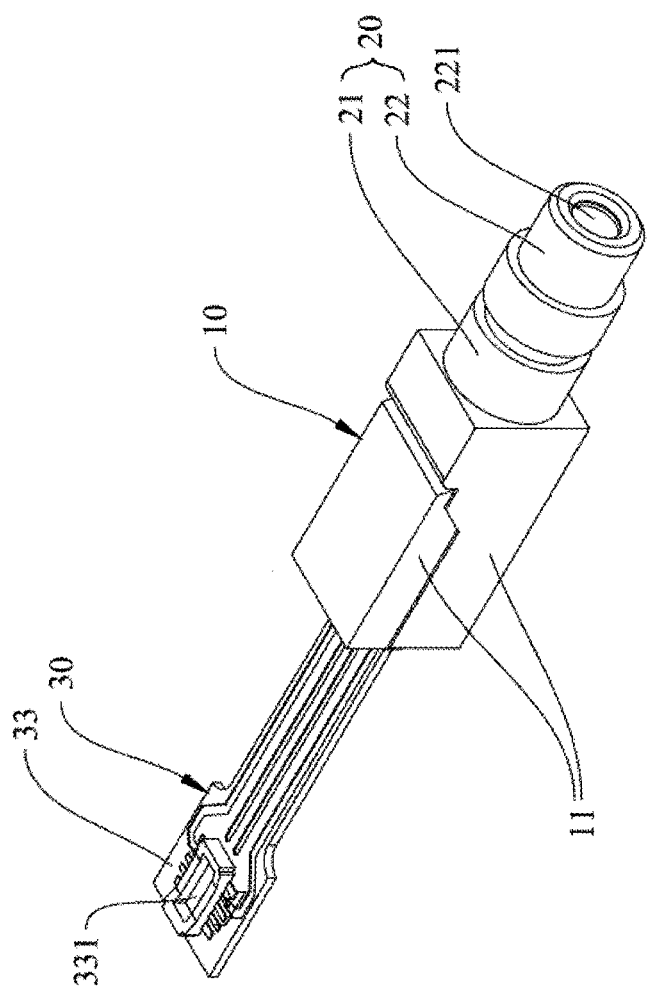
FIG. 3 is a perspective view of the optical transmitter of the present invention.

The optical transmitter of the present invention is hereunder illustrated with a preferred embodiment. FIG. 3 is a perspective view of an optical transmitter of the present invention, and the present invention is described hereunder with reference to the diagram.

The optical transmitter of the present invention 100 comprises a connector body 10, an optical calibration cylinder 20 coupled to the connector body 10, and a circuit substrate 30 disposed on the inner side of the connector body 10 and extended outward from the inner side of the connector body 10. The optical calibration cylinder 20 has thereon an optical fiber slot which an optical fiber is inserted into. The circuit substrate 30 is connected to a circuit board on a light communication device. In a preferred embodiment, the circuit substrate 30 has thereon a connector 331 and is electrically connected to the circuit board on the light communication device through the connector 331 such that the circuit substrate 30 is connected to a connector on the circuit board through the connector 331, thereby effectuating electrical connection. In another preferred embodiment, the circuit substrate 30 of the optical transmitter 100 is coupled and electrically connected to the circuit board on the light communication device by soldering. In another preferred embodiment, the light communication device has thereon a plurality of slots, and gold fingers disposed on one side of the circuit substrate 30 of the optical transmitter 100 are inserted into the slots such that the circuit substrate 30 of the optical transmitter 100 is electrically connected to the circuit board on the light communication device, but the present invention is not limited to the aforesaid embodiment. The circuit substrate 30 is a flexible printed circuit board, a ceramic printed circuit board (ceramic PCB), or a printed circuit board, but the present invention is not limited thereto. As a standalone module disposed in the light communication device, the optical transmitter 100 may be directly replaced when damaged.

Figure 4:
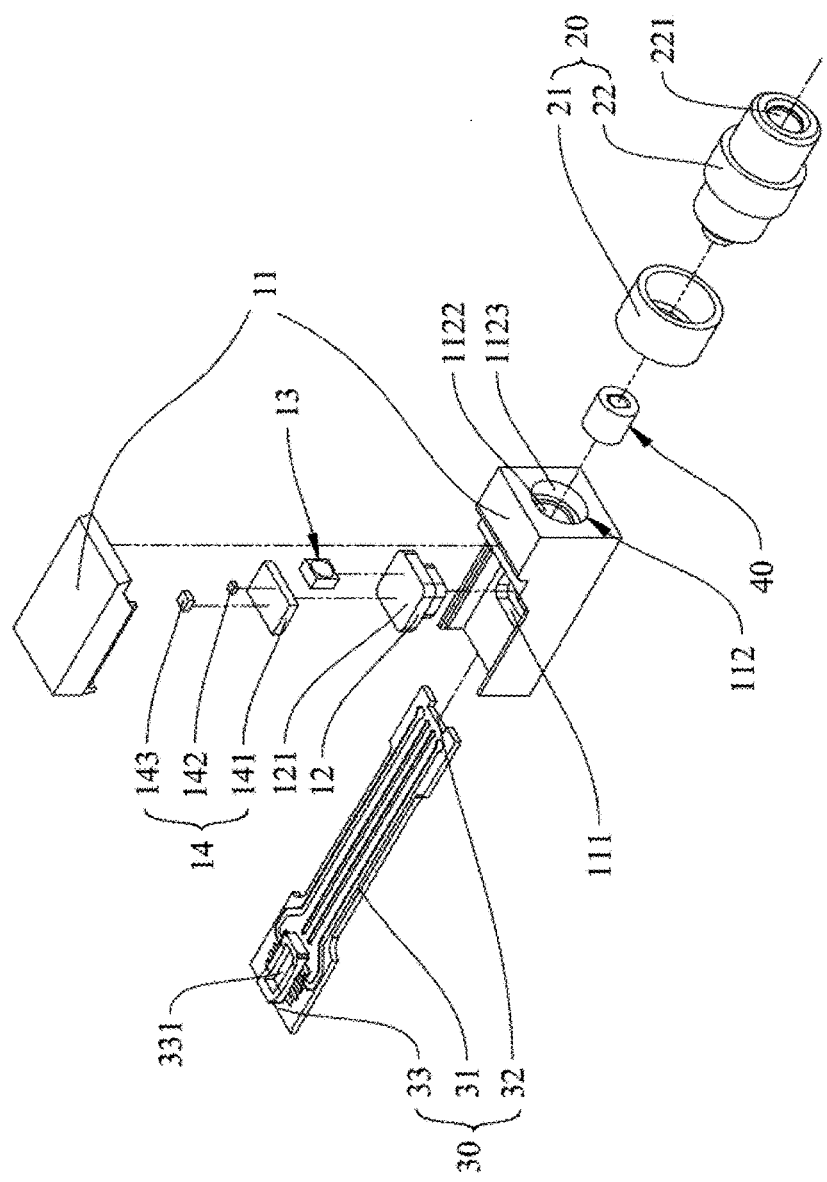
FIG. 4 is an exploded view of the optical transmitter of the present invention.
Figure 5:
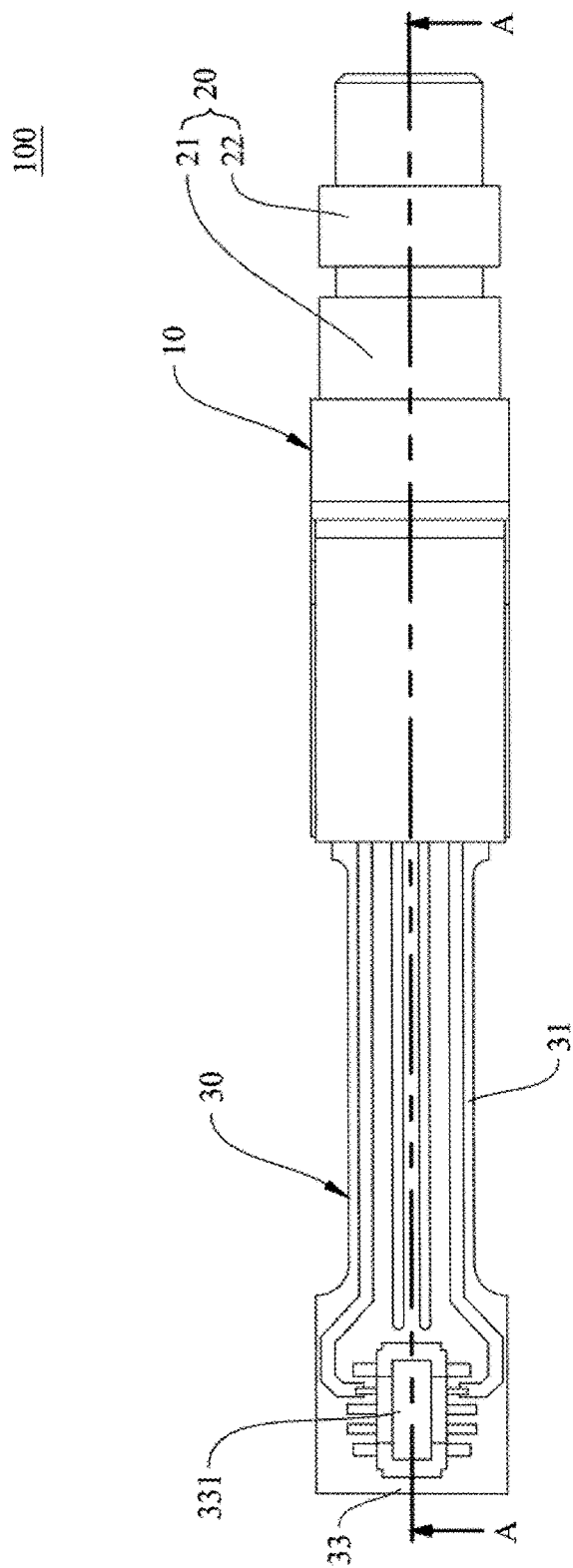
FIG. 5 is a top view of the optical transmitter of the present invention.
Figure 6:
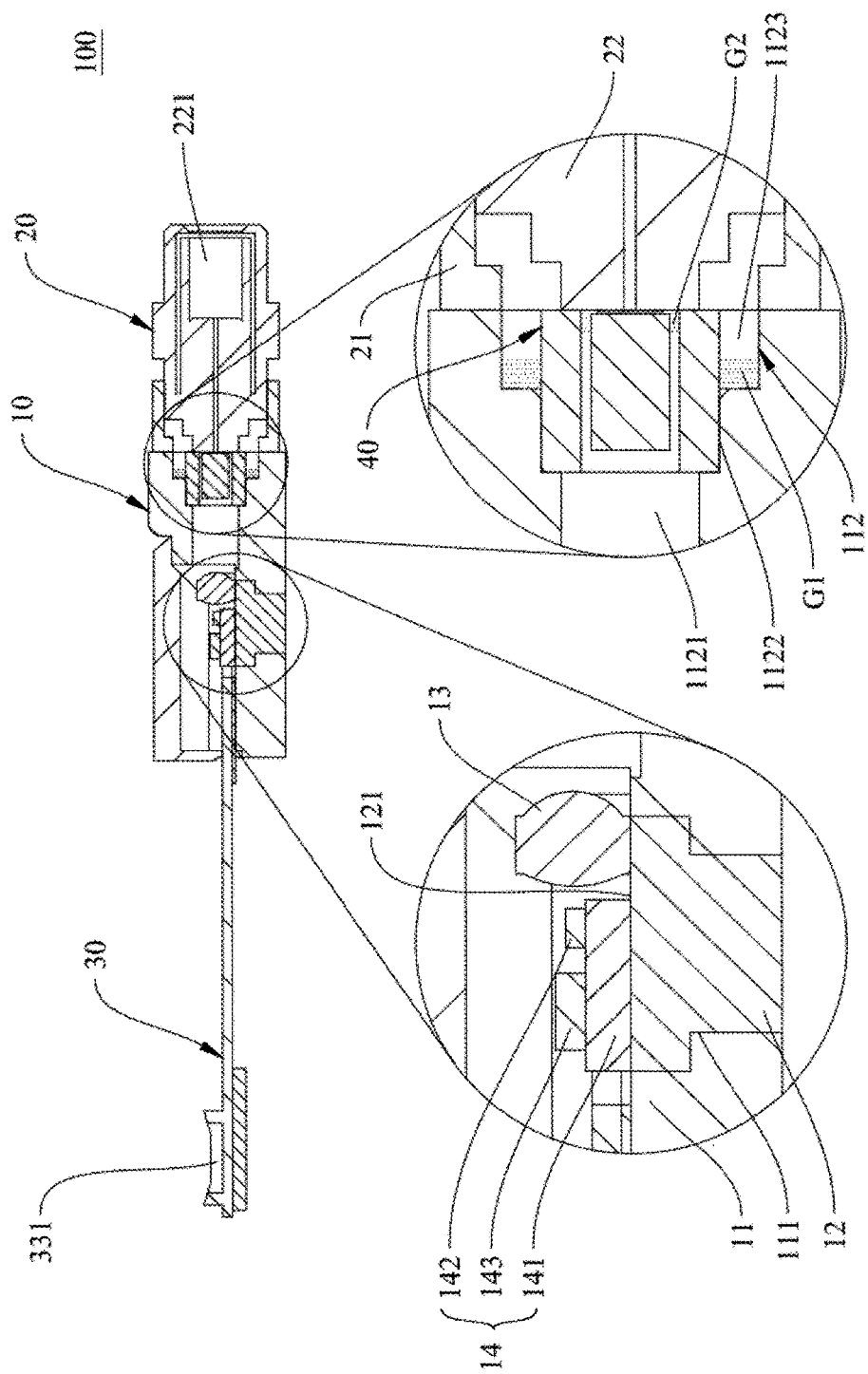
FIG. 6 is a cross-sectional view of the optical transmitter taken along line A-A of FIG. 5 according to the present invention.

Internal structures of the optical transmitter are described in detail below. Referring to FIG. 4, FIG. 5 and FIG. 6, there are shown an exploded view, a top view, and cross-sectional views of the optical transmitter of the present invention, respectively, and the present invention is described hereunder with reference to the diagrams.

The connector body 10 comprises a housing 11 with an optical calibration window 112 disposed thereon laterally, a thermal conductive block 12 fitted in the housing 11, a coupling lens 13, and an optical transmitter unit 14.

The housing 11 has therein a heat dissipation well 111, and the thermal conductive block 12 is insertedly disposed on the heat dissipation well 111. The heat dissipation well 111 penetrates the housing 11 such that two sides of the thermal conductive block 12 are exposed to two opposite openings of the heat dissipation well 111, respectively, and the housing 11 encloses the thermal conductive block 12 laterally and peripherally. The side (i.e., a heat guiding plane 121) attributed to the thermal conductive block 12 and protruding toward the inside of the housing 11 adjoins the optical transmitter unit 14. The other side of the thermal conductive block 12 is in contact with air, a heat guiding pad 702 (shown in FIG. 10) on a light communication device, or the inner side of a housing of the light communication device, but the present invention is not limited thereto. The thermal conductive block 12 has a step segment which corresponds in shape to the heat dissipation well 111. The step segment of the thermal conductive block 12 and the step segment of the heat dissipation well 111 together increases the contact area between the thermal conductive block 12 and the housing 11, thereby enhancing the efficiency of heat dissipation. The housing 11 is made of stainless steel, Kovar, or a combination thereof, but the present invention is not limited thereto. The thermal conductive block 12 is made of copper (Cu), copper alloy, copper-molybdenum (CuMo), copper-tungsten (CuW), aluminum (Al), aluminum alloy, heat-dissipating ceramics or any material of high thermal conductivity coefficient to enhance the efficiency of heat dissipation.

The housing 11 has thereon the circuit substrate 30. The circuit substrate 30 comprises a substrate body 31, an electrical connection side 32, and an electrical connection port 33. The electrical connection side 32 is disposed at one end of the substrate body 31 and connected to the optical transmitter unit 14. The electrical connection port 33 is disposed at one end of the substrate body 31 and opposite to the electrical connection side 32. In a preferred embodiment, an adhesive is applied to the interface between the electrical connection side 32 and the housing 11. The adhesive is a non-conductive glue-based adhesive which blocks the heat from the housing 11 or any glue capable of adhesion and thermal insulation. The adhesive provides thermal insulation to the circuit substrate 30 and the housing 11 to prevent the heat spread to the housing 11 from returning to the optical transmitter unit 14 through the electrical connection side 32 of the circuit substrate 30. The optical transmitter unit 14, which is disposed on the housing 11, is aligned with the optical calibration window 112 through the coupling lens 13. The optical transmitter unit 14 comprises a heat dissipating substrate 141 and a laser diode 142. The heat dissipating substrate 141 is directly disposed on the heat guiding plane 121 disposed on one side of the thermal conductive block 12. In a preferred embodiment, the heat dissipating substrate 141 is a ceramic heat dissipating substrate. The ceramic heat dissipating substrate is, for example, made of aluminum nitride (AlN), silicon carbide (SiC), aluminum oxide ($Al_2O_3$), a composite material comprising a combination thereof, or a compound or composite material which displays the properties of the aforesaid materials.

The laser diode 142 is directly disposed on the heat dissipating substrate 141. The laser diode 142 features an active region whose height is lowered to shorten a heat conduction path wherein heat is transferred from the active region to the heat guiding plane 121 and then horizontally from the heat guiding plane 121 to the housing 11 which encloses the heat dissipation well 111. In a preferred embodiment, the distance between the active region of the laser diode 142 and the contact interface of the laser diode 142 and the heat dissipating substrate 141 ranges from 2 μm to 14 μm. The distance does not include the thickness of a solder.

In another preferred embodiment, the thermal conductive block is inserted into the heat dissipation well in a direction from the outside of the housing to the inside of the housing, but the present invention is not limited thereto.

In a preferred embodiment, the laser diode 142 is an edge emitting laser diode, but the present invention is not limited thereto. The optical transmitter unit 14 further comprises an optical monitor 143 disposed on the heat dissipating substrate 141 and adapted to detect the output power of the laser diode 142.

In a preferred embodiment, the optical transmitter unit 14 and the coupling lens 13 are directly disposed on the heat guiding plane 121 of the thermal conductive block 12 to preclude a tolerance which might otherwise occur between the thermal conductive block 12 and the housing 11 when the optical transmitter unit 14 and the coupling lens 13 are disposed on the thermal conductive block 12 and the housing 11, respectively. Moreover, the heat guiding plane 121 is conducive to the heat dissipation of the coupling lens 13 and reduces the chance that the coupling lens 13 will deform at a high temperature caused by photo-thermal loss.

The housing 11 provides a hermetic seal with mechanisms and components inside the optical transmitter 100 to protect the optical transmitter unit 14 and the other components disposed inside the housing 11.

The optical calibration cylinder 20 is disposed on the optical calibration window 112 disposed on one side of the housing 11, and corresponds in position to the optical transmitter unit 14. The optical calibration cylinder 20 comprises a Z-axis positioning cylinder 21 and an optical receptacle 22. The Z-axis positioning cylinder 21 is coupled to a plane on one side of the optical calibration window 112. A slot 221 is disposed on one side of the Z-axis positioning cylinder 21 such that the optical fiber is inserted into the slot 221 for the sake of connection. The optical calibration window 112 comprises an optical channel 1121 aligned with the coupling lens 13, an insertion groove 1122 disposed on the optical channel 1121, and a yielding groove 1123 disposed on one side of the insertion groove 1122. The optical calibration window 112 has thereon an optical isolator 40. The optical isolator 40 is inserted into the insertion groove 1122 and thus fixed in place. The inner diameter of the yielding groove 1123 disposed on one side of the insertion groove 1122 is larger than the inner diameter of the insertion groove 1122 to retain part of the space and thus reduce the difficulty in inserting the optical isolator 40 into the insertion groove 1122. Moreover, the outer periphery of the optical isolator 40 is in contact with the inner side of the insertion groove 1122. To dispense glue, it is feasible to apply glue G1 to the yielding groove 1123, particularly at a part thereof corresponding in position to a point of connection between the optical isolator 40 and the insertion groove 1122, so as to effectuate a hermetic seal. In a preferred embodiment, to augment airtightness, the optical isolator 40 has therein polarizers coupled to a Faraday rotator, and further glue G2 is applied to the interface between the polarizers and a magnetic ring surrounding the polarizers and a Faraday rotator, but the present invention is not limited thereto.

Mounting the optical transmitter 100 in place entails positioning the light adapter 22 on the Z-axis positioning cylinder 21 and then calibrating the light adapter 22 with a coupling apparatus. The coupling apparatus tests and determines optimal coupling positions of the light adapter 22 and the Z-axis positioning cylinder 21 on Z-axis, and then the light adapter 22 is fixed to the Z-axis positioning cylinder 21 by electric welding or laser welding such that the positions of the light adapter 22 and the optical calibration window 112 on Z-axis plane relative to each other are fixed. Afterward, the optical calibration cylinder 20 is moved across XY plane to fix the optical calibration cylinder 20 to the optical calibration window 112 by electric welding or laser welding as soon as the optimal coupling positions are found, thereby fixing the optical calibration cylinder 20 and the optical calibration window 112 to their relative positions on XY plane.

Figure 7:
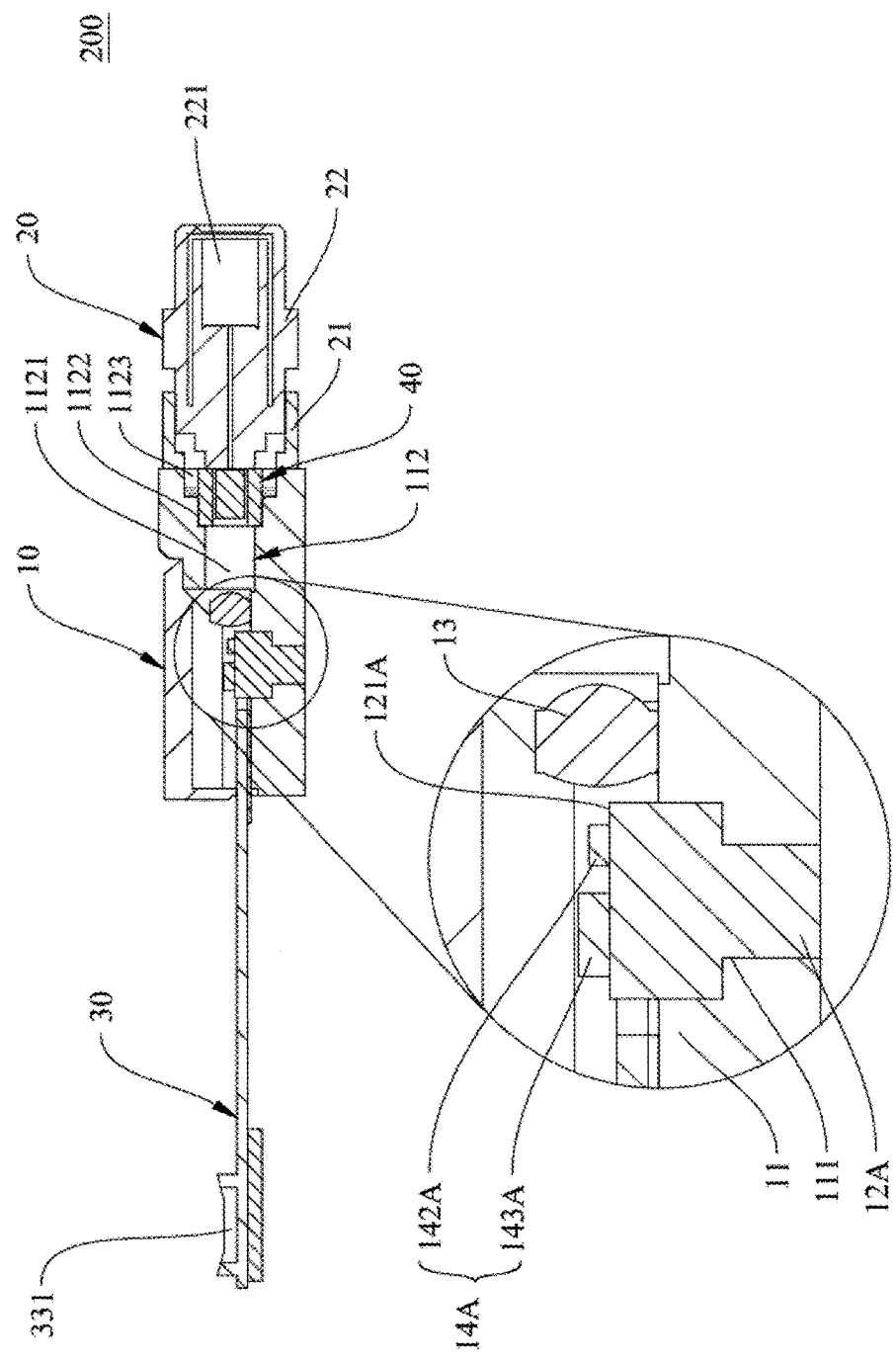
FIG. 7 is a cross-sectional view of another preferred embodiment of the present invention.

Referring to FIG. 7, there are shown cross-sectional views of another preferred embodiment of the present invention, and the present invention is described hereunder with reference to the diagram.

This embodiment is identical to the embodiment shown in FIG. 2 in terms of a heat dissipation structure but is distinguished from the preceding embodiment mainly by a thermal conductive block 12A. Due to the thermal conductive block 12A, this embodiment dispenses with a heat dissipating substrate (i.e., the heat dissipating substrate 141 shown in FIG. 6) as well as reduces parts and components which might otherwise be required for the optical transmitter 200.

In this embodiment, the heat dissipation well 111 is disposed on the housing 11 of the optical transmitter 200, whereas the thermal conductive block 12A is inserted into and fixed to the heat dissipation well 111. One side of the thermal conductive block 12A protrudes from the housing 11 and is taller than the housing 11 by a height. The thermal conductive block 12A has a heat guiding plane 121A at the height. The optical transmitter unit 14A is disposed on the thermal conductive block 12A. The optical transmitter unit 14A comprises a laser diode 142A directly disposed on the heat guiding plane 121A and an optical monitor 143A disposed on the heat guiding plane 121A to detect the power of the laser diode 142A. The laser diode 142A features an active region whose height is lowered to shorten a heat conduction path wherein heat is transferred from the active region to the heat guiding plane 121A such that the heat already transferred to the heat guiding plane 121A is transferred horizontally to the housing 11 at the periphery of the heat dissipation well 111 through the thermal conductive block 12A.

Upon reduction of the height of the active region, the distance between the active region of the laser diode 142A and the contact interface of the laser diode 142A and the heat guiding plane 121A ranges from 2 µm to 14 µm. The efficiency of heat dissipation is greatly enhanced by reducing the distance between the active region and the thermal conductive block 12A. The distance does not include the thickness of a solder.

Figure 8:
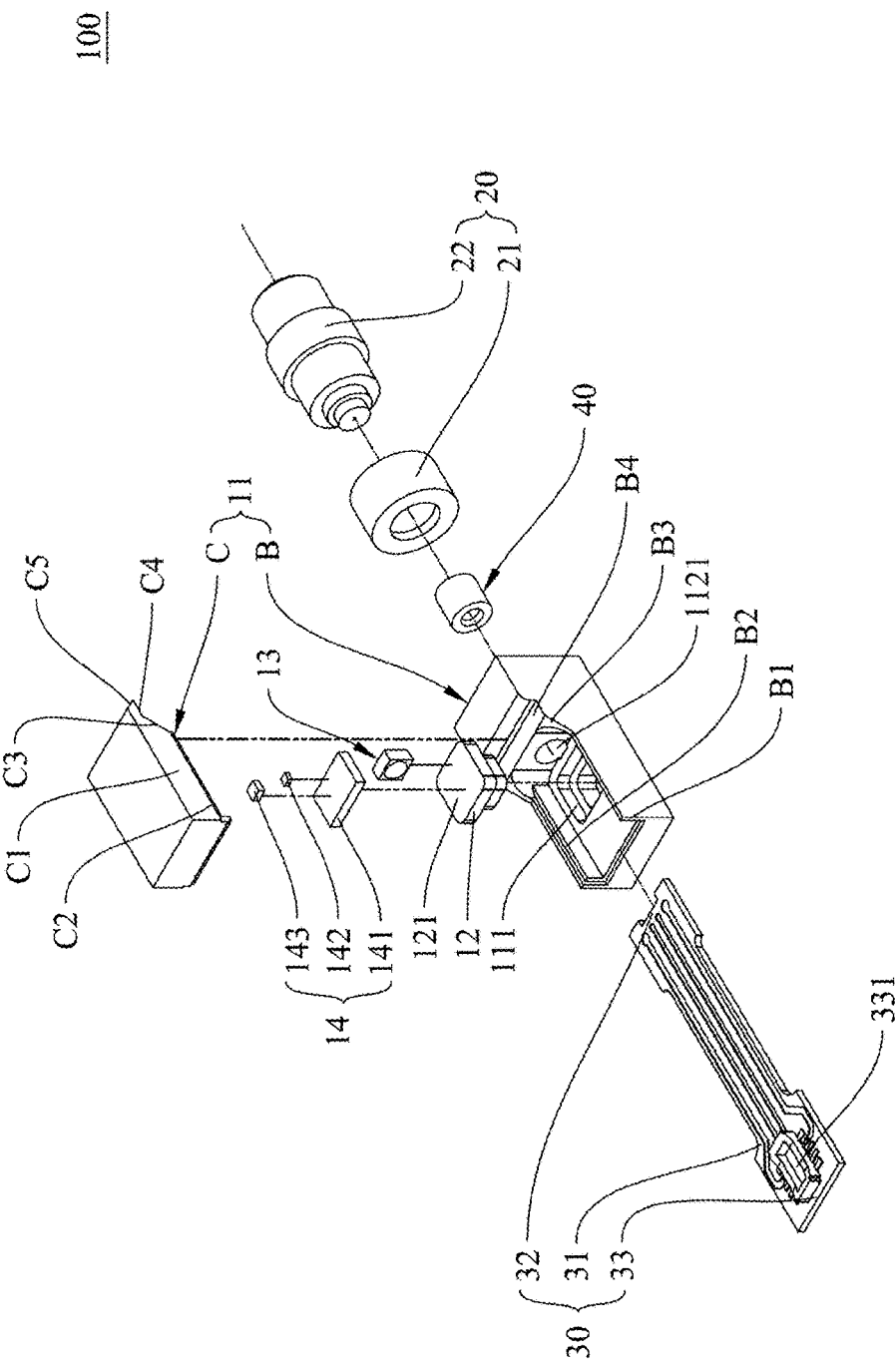
FIG. 8 is an exploded view 1 of the optical transmitter of the present invention from another angle.
Figure 9:
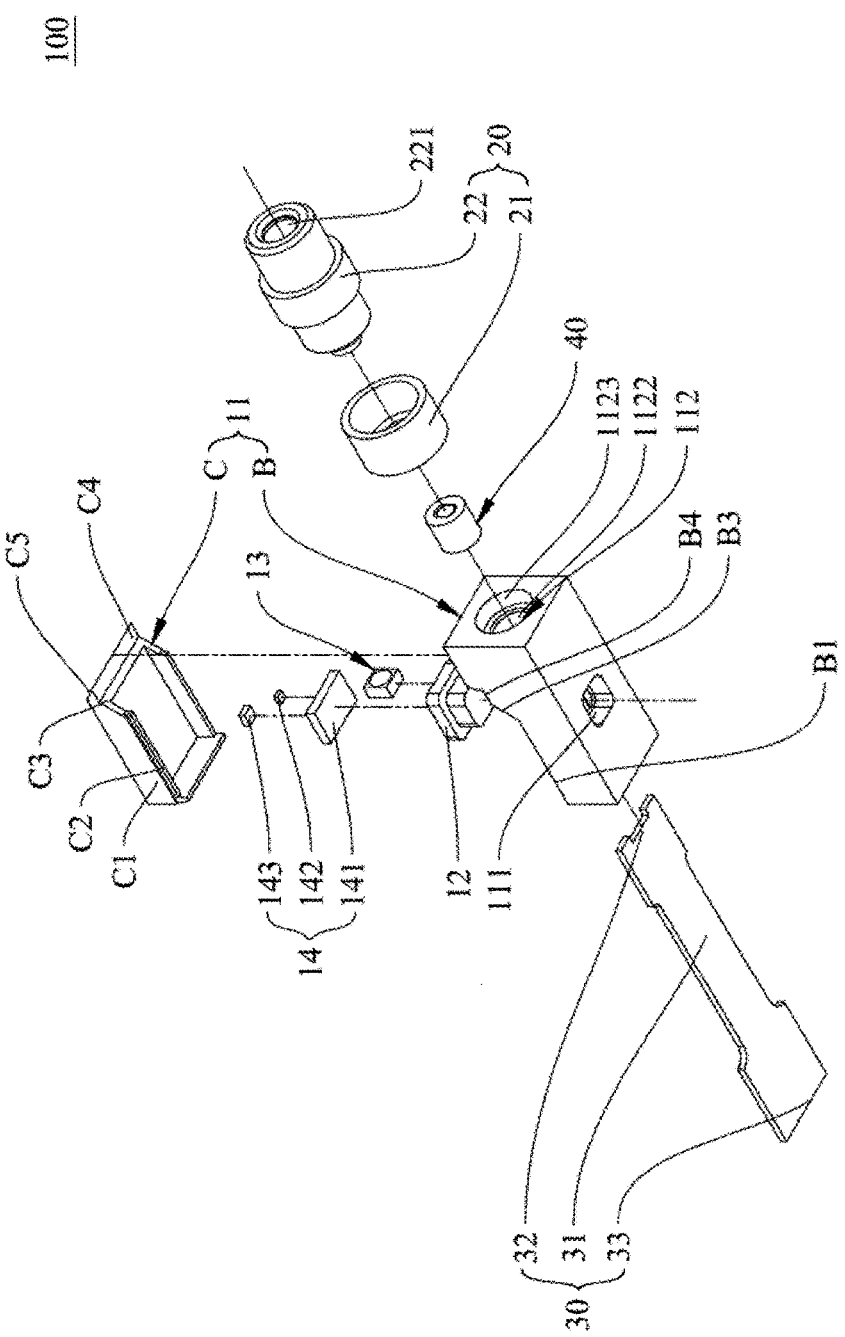
FIG. 9 is an exploded view 2 of the optical transmitter of the present invention from one another angle.

The housing is assembled using the structures described below so as to achieve airtightness. Referring to FIG. 8 and FIG. 9, there are shown exploded views of the optical transmitter of the present invention, respectively.

In this embodiment of the optical transmitter 100, the housing 11 mainly consists of two parts. The housing 11 comprises a base B which comes with the thermal conductive block 12 and an upper lid C which covers the base B to provide the optical transmitter unit with a hermetic seal 14.

The base B has two sides which two first sidewalls B1 are disposed on, respectively. Two first step segments B2 are disposed on the first sidewalls B1, respectively. The first sidewalls B1 each extend to form a first slope portion B3. The first slope portions B3 each extend forward to form an engaging platform B4.

The upper lid C is flanked by two second sidewalls C1. The second sidewalls C1 each have thereon a second step segment C2. The second sidewalls C1 each extend to form a second slope portion C3. The second slope portions C3 each extend to form a protruding portion C4 which is laterally inclined to the engaging platform at a chamfering angle C5.

When the upper lid C is mounted on the base B, the second step segments C2 of the second sidewalls C1 which flank the upper lid C and the first step segments B2 are engaged with each other, respectively, whereas the second slope portions C3 and the first slope portions B3 are engaged with each other, respectively, and thus overlapped. The protruding portion C4 disposed at the front end of the upper lid C rest on the engaging platform B4, respectively. A glue dispensing process entails applying a glue to the point of connection between the upper lid C and the base B such that the glue is eventually introduced into the point of connection between the protruding portion C4 and the engaging platform B4 on the base B for the sake of adhesion. The chamfering angle C5 of the protruding portion C4 accommodate and support the dispenser needle during the glue-applying process as well as guide the glue to stay still rather spread outward. The rear end of the upper lid C has an opening penetrable by the circuit substrate 30. The opening is coated with the glue, and then the glue is cured to seal the opening. Hence, the base B and the upper lid C are engaged in an airtight manner.

Figure 10:
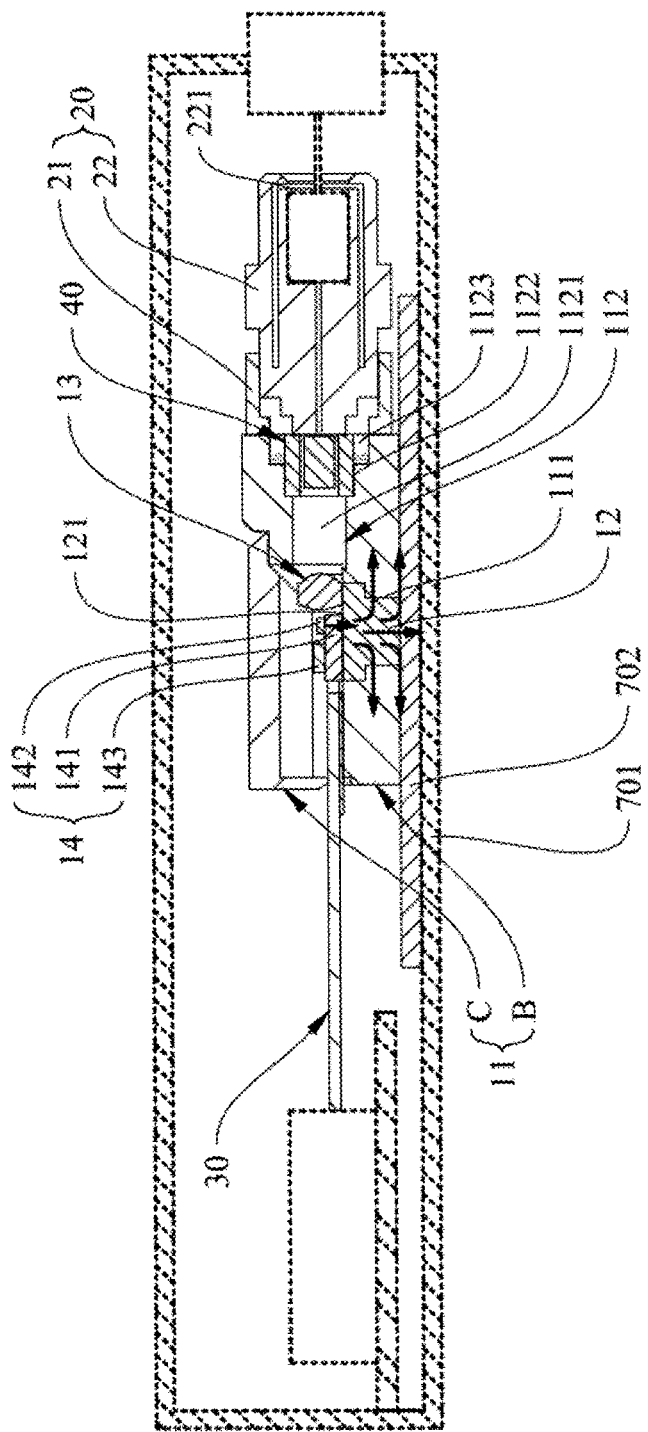
FIG. 10 is a schematic view of heat transfer of a light communication device of the present invention.

FIG. 10 is a schematic view of heat conduction of the optical transmitter of the present invention, and the present invention is described hereunder with reference to the diagram.

Since the height of the active region of the laser diode 142 is reduced, the active region of the laser diode 142 is close to the contact interface of the laser diode 142 and the heat dissipating substrate 141 such that a semiconductor layer between them is very thin, thereby allowing heat to be directly transferred to the heat dissipating substrate 141 below (or, for example, the thermal conductive block 12A shown in FIG. 7). The heat dissipating substrate 141 is in direct contact with the underlying heat guiding plane 121 of the thermal conductive block 12. Hence, heat generated from the active region is transferred to the underlying thermal conductive block 12 by following the shortest path. Since the path is made of materials of high thermal conductivity, a heat spreading angle can be minimized, and the heat is directly and quickly transferred to the thermal conductive block 12 through the shortest path and then spread from the bottom of the thermal conductive block 12 or the surfaces of the housing 11.

In a preferred embodiment of the present invention, when the optical transmitter 100 is mounted on a light communication device 300, one or more heat guiding pads 702 are mounted thereon to be shared by the optical transmitter 100 or used by the optical transmitter 100 separately and in contact with the other outward-exposed side of the thermal conductive block 12. With the heat guiding pad 702, heat from the thermal conductive block 12 is transferred uniformly to a housing 701 of the light communication device 300 to enhance the efficiency of heat dissipation of the laser diode 142.

A solder is applied to the interface between the laser diode 142, the heat dissipating substrate 141, and the thermal conductive block 12 and then cured at a high temperature for the sake of adhesion, without there between using any thermal-resistance material, such as PCB, or FPC, thereby further speeding up the spreading of heat. In a preferred embodiment, the thermal conductive block 12 is made of copper-tungsten (CuW), because copper-tungsten exhibits a high coefficient of thermal conductivity and thus enables heat to be transferred to the air through the thermal conductive block 12 quickly, thereby enhancing the efficiency of heat dissipation. The solder is a gold-tin alloy, a solder preform, or any material with a high coefficient of thermal conductivity, but the present invention is not limited thereto. In another preferred embodiment, the laser diode 142, the heat dissipating substrate 141, and the thermal conductive block 12 are cured at a high temperature and thus adhered to each other, by a material which is of high thermal-conductivity and adhesive, but the present invention is not limited thereto.

According to the above, the present invention provides a laser diode having an active region whose height is lowered to shorten a heat conduction path; heat is directly transferred from the active region to the thermal conductive block through the heat dissipating substrate, so as to effectuate heat dissipation through direct heat conduction; and the heat is spread by means of a heat dissipation well horizontally. In addition, the present invention is further characterized in that the adhesive is applied to the interface between the electrical connection side of the circuit substrate and the housing to insulate the housing thermally so that the heat already transferred to the housing is prevented from returning to the laser diode through gold bonding wires to influence the efficiency of dissipating heat from the laser diode.

While the present invention has been described in connection with certain exemplary embodiments, it is to be understood that the invention is not limited to the disclosed embodiments, but, on the contrary, intended to cover various modifications and equivalent arrangements included within the spirit and scope of the appended claim, and the equivalent thereof.

What is claimed is:

1. An optical transmitter with a heat dissipation structure, comprising:
    a substrate comprising a base body, a heat dissipation well disposed on the base body, and a thermal conductive block inserted into and fixed to the heat dissipation well and having a side with a heat guiding plane thereon; and an optical transmitter unit disposed on the thermal conductive block and comprising a heat dissipating substrate directly disposed on the heat guiding plane and a laser diode directly disposed on the heat dissipating substrate;

wherein the laser diode has an active region, and the distance between the active region and the contact interface of the laser diode and the heat dissipating substrate ranges from 2 µm to 14 µm, for shortening a heat conduction path of heat transferred from the active region through the heat dissipating substrate to the heat guiding plane; wherein the heat already transferred to the heat guiding plane is transferred horizontally to the base body enclosing the heat dissipation well.

2. The optical transmitter with a heat dissipation structure of claim 1, wherein the substrate is a housing which comprises an optical calibration window, a coupling lens disposed on thermal conductive block at one side of the optical calibration window, and the optical transmitter unit disposed in the housing and aligned with the optical calibration window through the coupling lens;

the lateral side of the housing has an optical calibration cylinder, which is disposed on the optical calibration window and corresponding in position to the laser diode, and the optical calibration cylinder comprises a Z-axis positioning cylinder coupled to the optical calibration window laterally as well as an optical receptacle insertedly disposed at the Z-axis positioning cylinder to connect with an optical fiber.

3. The optical transmitter with a heat dissipation structure of claim 2, wherein the coupling lens are directly disposed on the thermal conductive block.

4. The optical transmitter with a heat dissipation structure of claim 2, wherein the heat dissipation well penetrates the housing such that two sides of the thermal conductive block are exposed to two opposite openings of the heat dissipation well, respectively, and the housing encloses the thermal conductive block laterally and peripherally, one side of the thermal conductive block protruding toward the inside of the housing adjoins the optical transmitter unit, and the other outward-exposed side of the thermal conductive block is in contact with a heat guiding pad.

5. The optical transmitter with a heat dissipation structure of claim 2, wherein the housing comprises a base which comes with the thermal conductive block and an upper lid which covers the base to provide the optical transmitter unit with a hermetic seal;

the base has two sides which two first sidewalls are disposed on, respectively, and two first step segments are disposed on the first sidewalls, respectively, and the upper lid has two sides which two second sidewalls corresponding to the first sidewalls are disposed on, respectively, and the second sidewalls each have thereon a second step segment whereas the second step segment and the first step segment are engaged with each other, respectively;

the first sidewall of the base extends to form a first slope portion and the second sidewall of the upper lid extends to form a second slope portion, wherein the second slope portions and the first slope portions are engaged with each other, respectively;

the first slope portions extend forward to form an engaging platform and the second slope portions extend to form a protruding portion which is laterally inclined to the engaging platform at a chamfering angle and disposed at the front end of the upper lid resting on the engaging platform.

6. The optical transmitter with a heat dissipation structure of claim 2, wherein the optical calibration window comprises an optical channel aligned with the coupling lens and an insertion groove disposed on the optical channel for an optical isolator inserted into and thus fixed in place; and a yielding groove is disposed on one side of the insertion groove as well as the inner diameter of the yielding groove is larger than the inner diameter of the insertion groove.

7. The optical transmitter with a heat dissipation structure of claim 2, wherein the housing has thereon a circuit substrate, wherein the circuit substrate comprises a substrate body, an electrical connection side disposed at one end of the substrate body and connected to the optical transmitter unit, and an electrical connection port disposed at one end of the substrate body and opposite to the electrical connection side, wherein an adhesive for blocking heat from the housing is applied to the interface between the electrical connection side and the housing so that the heat is prevented from returning to the optical transmitter unit through gold bonding wires of the electrical connection side.

8. The optical transmitter with a heat dissipation structure of claim 1, wherein the heat dissipating substrate is a ceramic heat dissipating substrate, the ceramic heat dissipating substrate is made of aluminum nitride (AlN), silicon carbide (SiC) or aluminum oxide ($Al_2O_3$).

9. The optical transmitter with a heat dissipation structure of claim 1, wherein the heat guiding plane of the thermal conductive block is parallel to the surface of the base body.

10. The optical transmitter with a heat dissipation structure of claim 1, wherein the thermal conductive block is made of copper (Cu), copper alloy, copper-molybdenum (CuMo), copper-tungsten (CuW), aluminum (Al), aluminum alloy, or heat-dissipating ceramics.

11. The optical transmitter with a heat dissipation structure of claim 1, wherein the laser diode is an edge emitting laser diode.

12. An optical transmitter with a heat dissipation structure, comprising:

a substrate comprising a base body, a heat dissipation well disposed on the base body, and a thermal conductive block inserted into and fixed to the heat dissipation well, wherein one side of the thermal conductive block protrudes from the base body and is taller than the base body by a height and thermal conductive block has a heat guiding plane at the height; and an optical transmitter unit disposed on the thermal conductive block comprises a laser diode directly disposed on a heat dissipating substrate, with the laser diode having an active region, and the distance between the active region and the contact interface of the laser diode and the heat dissipating substrate ranges from 2 µm to 14 µm, for shortening a heat conduction path of heat transferred from the active region to the heat guiding plane; wherein the heat already transferred to the heat guiding plane is transferred horizontally to the base body enclosing the heat dissipation well.

13. The optical transmitter with a heat dissipation structure of claim 12, wherein the substrate is a housing which comprises an optical calibration window, a coupling lens disposed on thermal conductive block at one side of the optical calibration window, the optical transmitter unit disposed in the housing and aligned with the optical calibration window through the coupling lens;

the lateral side of the housing has an optical calibration cylinder, which is disposed on the optical calibration window and corresponding in position to the laser diode, the optical calibration cylinder comprises a Z-axis positioning cylinder coupled to the optical calibration window laterally as well as an optical receptacle insertedly disposed at the Z-axis positioning cylinder to connect with an optical fiber.

14. The optical transmitter with a heat dissipation structure of claim 13, wherein the heat dissipation well penetrates the housing such that two sides of the thermal conductive block are exposed to two opposite openings of the heat dissipation well, respectively, and the housing encloses the thermal conductive block laterally and peripherally, one side of the thermal conductive block protruding toward the inside of the housing adjoins the optical transmitter unit, and the other outward-exposed side of the thermal conductive block is in contact with a heat guiding pad.

15. The optical transmitter with a heat dissipation structure of claim 13, wherein the housing comprises a base which comes with the thermal conductive block and an upper lid which covers the base to provide the optical transmitter unit with a hermetic seal;
   the base has two sides which two first sidewalls are disposed on, respectively, and two first step segments are disposed on the first sidewalls, respectively, and the upper lid has two sides which two second sidewalls corresponding to the first sidewalls are disposed on, respectively, and the second sidewalls each have thereon a second step segment whereas the second step segment and the first step segment are engaged with each other, respectively;
   the first sidewall of the base extends to form a first slope portion and the second sidewall of the upper lid extends to form a second slope portion, wherein the second slope portions and the first slope portions are engaged with each other, respectively;
   the first slope portions extend forward to form an engaging platform and the second slope portions extend to form a protruding portion which is laterally inclined to the engaging platform at a chamfering angle and disposed at the front end of the upper lid resting on the engaging platform.

16. The optical transmitter with a heat dissipation structure of claim 13, wherein the optical calibration window comprises an optical channel aligned with the coupling lens and an insertion groove disposed on the optical channel for an optical isolator inserted into and thus fixed in place; and
   a yielding groove is disposed on one side of the insertion groove as well as the inner diameter of the yielding groove is larger than the inner diameter of the insertion groove.

17. The optical transmitter with a heat dissipation structure of claim 13, wherein the housing has thereon a circuit substrate, wherein the circuit substrate comprises a substrate body, an electrical connection side disposed at one end of the substrate body and connected to the optical transmitter unit, and an electrical connection port disposed at one end of the substrate body and opposite to the electrical connection side, wherein an adhesive for blocking heat from the housing is applied to the interface between the electrical connection side and the housing so that the heat is prevented from returning to the optical transmitter unit through gold bonding wires of the electrical connection side.

18. The optical transmitter with a heat dissipation structure of claim 12, wherein the thermal conductive block is made of copper (Cu), copper alloy, copper-molybdenum (CuMo), copper-tungsten (CuW), aluminum (Al), aluminum alloy, or heat-dissipating ceramics.

19. The optical transmitter with a heat dissipation structure of claim 12, wherein the laser diode is an edge emitting laser diode.

* * * * *